US007268171B2

(12) United States Patent
Tanaka et al.

(10) Patent No.: US 7,268,171 B2
(45) Date of Patent: Sep. 11, 2007

(54) WATER-BASED COATING COMPOSITION CURABLE WITH ACTINIC ENERGY RAY, COATED METALLIC MATERIAL WITH CURED FILM OF THE COMPOSITION, PRODUCTION PROCESS, AND METHOD OF BONDING COATED METALLIC MATERIAL

(75) Inventors: Shigehiro Tanaka, Kitaadachi-gun (JP); Masanori Takase, Hasuda (JP); Hiroshi Matsuo, Hatogaya (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 63 days.

(21) Appl. No.: 10/257,945

(22) PCT Filed: Apr. 26, 2001

(86) PCT No.: PCT/JP01/03609

§ 371 (c)(1), (2), (4) Date: Oct. 23, 2002

(87) PCT Pub. No.: WO01/83627

PCT Pub. Date: Nov. 8, 2001

(65) Prior Publication Data

US 2003/0130371 A1 Jul. 10, 2003

(30) Foreign Application Priority Data

Apr. 27, 2000 (JP) ............................ 2000-127595

(51) Int. Cl.
*C08J 3/28* (2006.01)

(52) U.S. Cl. ........................... 522/64; 522/84; 522/85; 522/162

(58) Field of Classification Search ................. 522/162
See application file for complete search history.

(56) References Cited

U.S. PATENT DOCUMENTS 3,867,351 A * 2/1975 Juna et al. .................... 528/71
4,039,414 A * 8/1977 McGinniss .................. 204/478
4,385,097 A * 5/1983 Isozaki et al. .............. 428/458
4,522,961 A * 6/1985 Martino et al. ............. 523/407
5,344,858 A 9/1994 Hart et al. .................. 523/411
5,348,991 A * 9/1994 Yoshikawa et al. ......... 523/402
5,369,139 A 11/1994 Boeckeler et al. ............ 522/21
6,099,968 A * 8/2000 Harakawa et al. .......... 428/414
6,207,744 B1 * 3/2001 Paulus et al. ............... 524/507
6,265,461 B1 * 7/2001 Urbano et al. .............. 522/111

FOREIGN PATENT DOCUMENTS

| | | |
|---|---|---|
| CA | 1 262 794 | 11/1989 |
| EP | 0 174 628 | 3/1986 |
| JP | 49-14626 | 4/1974 |
| JP | 61-83262 | 4/1986 |
| JP | 2-41555 | 9/1990 |
| JP | 5-320568 | 12/1993 |
| JP | 7-275788 | 10/1995 |
| JP | 8-259888 | 10/1996 |
| JP | 9-31150 | 2/1997 |
| JP | 10-251360 | 9/1998 |
| JP | 10-251361 | 9/1998 |
| JP | 10-298213 | 11/1998 |
| JP | 2000-141873 | 5/2000 |
| JP | 2000-178761 | 6/2000 |

OTHER PUBLICATIONS

Taiwanese Office Action dated Dec. 8, 2003.

* cited by examiner

*Primary Examiner*—Monique R. Jackson
(74) *Attorney, Agent, or Firm*—Edwards Angell Palmer & Dodge LLP

(57) ABSTRACT

A radiation curable aqueous coating composition comprises an aqueous resin having a chemically bonded phosphate group and an ethylenic unsaturated double bond, and/or a phosphate compound having an ethylenic unsaturated double bond and an aqueous resin having an ethylenic unsaturated double bond, which has high solvent resistance and adhesion to the surface of the metal material.

7 Claims, No Drawings

WATER-BASED COATING COMPOSITION CURABLE WITH ACTINIC ENERGY RAY, COATED METALLIC MATERIAL WITH CURED FILM OF THE COMPOSITION, PRODUCTION PROCESS, AND METHOD OF BONDING COATED METALLIC MATERIAL

TECHNICAL FIELD

The present invention relates to a radiation curable aqueous coating composition having excellent adhesion and excellent solvent resistance, a coated metal material with a coating film having excellent adhesion to the surface of a metal material and excellent solvent resistance, and a manufacturing method therefor, and a method for joining a coated metal material comprising a coating film.

BACKGROUND ART

In the field of painting/coating, to obtain a coating viscosity suitable for a coating step such as coating and printing, a solvent type coating composition to be diluted with a solvent has been widely used heretofore. However, the use of an organic solvent has problems in aspects of safety and health as well as working environment. In the case of a solvent-free type coating composition, a step of drying the solvent is not required, however, a step of heating of the coating composition is sometimes required to obtain a coating viscosity. This presented problems such as skin toxicity and odor of a diluting monomer to be added, similar to the solvent type coating composition. Moreover, a polymer material cannot be used because of limitation of the coating viscosity, and therefore chemical and physical performances of the coating film cannot be easily improved.

For the coating composition for coating metals used to protect surfaces of molding metal materials and metal plates, not only safety and environmental compatibility, but also generally required performances such as hardness of coating film, high adhesion and solvent resistance specific to the field of metal coating, and performances which make it possible to weld directly without removing a protective coating film formed in a welding step in post-processing, are required.

To solve these problems, intensive study and development about an aqueous coating composition have recently been made. Dispersion or dissolution of a resin in an aqueous medium is attained by using a dispersant or an emulsifier, or an action of a dispersible group, emulsifiable group or soluble group localized internally (ionic functional group or a nonionic functional group), and the latter self-emulsifiable or self-soluble resin has secured comparatively excellent performances. However, since it is required to introduce sufficient water-soluble functional groups to attain self-emulsion in a molecule, good balance between the water resistance and the emulsifiability is necessary, resulting in poor physical properties of the coating film such as boiling water resistance and solvent resistance.

Japanese Unexamined Patent Application, First Publication, No. Sho 61-83262, Japanese Examined Patent Application, Second Publication, No. Hei 2-41555, and Japanese Unexamined Patent Application, First Publication, No. 5-320568 disclose a method of adding a reaction product of an epoxy resin and phosphoric acid or a reaction product of an epoxy resin, a phosphate and carboxylic acid into an aqueous acrylic resin and an aqueous amino resin as the method of improving the adhesion of a thermosetting composition. Although the resulting thermosetting composition has excellent adhesion, a thin coating film having a thickness of several microns does not satisfy the solvent resistance, adhesion and workability. Various methods have been suggested, but there has never been suggested a thin coating film having a thickness of several microns formed on the surface of a metal material, particularly a metal sheet, which has excellent adhesion, durability to severe working and excellent resistance to a solvent, particularly a polar solvent.

Recently, a radiation curable aqueous coating composition has been intensively studied as an environmentally friendly coating composition using no organic solvent. As a resin, which is a basic component constituting a coating film-forming component, for example, a polyurethane resin, an acrylic resin, a polyester resin and an epoxy resin are known. The acrylic resin has an excellent chemical resistance because of a carbon-carbon bond on a principal chain, but cannot easily attain high workability. The polyester resin can attain excellent workability because of a flexible ester bond on a principal chain, but has poor chemical resistance such as acid resistance or alkali resistance. The epoxy resin has excellent adhesion and excellent chemical resistance, but cannot easily attain good balance between high workability and solvent resistance. Thus, these resins have good points and bad points. The polyurethane resin has a drawback that a urethane bond and a hydrogen bond are liable to be formed by the reaction of isocyanate as a raw material, thus resulting in high viscosity. However, since good balance between the functionality and performance can be easily attained by utilizing high reactivity of an isocyanate group and the urethane bond exists in a molecule, molecules entangle with each other via the hydrogen bonds and serve as a pseudo-polymer, and therefore, the resulting coating film is superior in adhesion.

For example, an invention described in Japanese Unexamined Patent Application, First Publication No. Hei 8-259888 provides an aqueous dispersion comprising water and radiation curable microgel particles dispersed in water as a polyurethane resin-based radiation curable aqueous coating composition having excellent coating film-forming property. The microgel particles are gel-like coating film-forming polyurethane resin particles comprising polyurethane resins and a crosslinked structure obtained by crosslinking polyurethane resins via a urethane bond or a urea bond, and said resin particles have a radiation curable ethylenic unsaturated double bond and a group of a salt. In the above Publication, it is described that the coating film-forming polyurethane resin particles can contain 1 to 50% of the other radiation curable compound and an initiator for radiation curing reaction therein, and that an aqueous coating film having excellent workability and excellent solvent resistance can be obtained by using these radiation curable microgel particles.

Japanese Unexamined Patent Application, First Publication No. Hei 9-31150 discloses, as a composition capable of forming a highly crosslinked coating film, a radiation curable aqueous polyurethane resin composition prepared by reacting a product, which is obtained by the Michael addition of a hydroxyl compound having an active hydrogen to a double bond of a compound having two or more (meth) acryloyl groups, a polyhydroxy compound having an acidic group and a polyisocyanate as an indispensable component. Generally, a composition having an acryloyl group, which is superior in curability, has conventionally been used as a radiation curable composition, and Japanese Unexamined Patent Application, First Publication No. Hei 10-251360 discloses that a radiation curable aqueous polyurethane composition having an methacryloyl group is superior in adhesion, chemical resistance, surface hardness and yellowing resistance, and is used in coating compositions, coating agents and inks.

In Japanese Unexamined Patent Application, First Publication No. Hei 10-251361, it is described that excellent adhesion, excellent solvent resistance, excellent workability and excellent coatability can be obtained by mixing radiation curable microgel particles with a radiation curable aqueous polyurethane resin.

These radiation curable aqueous polyurethane resin compositions are used in coating compositions, coating agents and inks because of excellent adhesion to any organic material (e.g. plastic films, wood construction materials and decorative papers for construction materials) and inorganic materials (e.g. metal materials and glass) and excellent solvent resistance. Any of them is a radiation curable aqueous composition containing an aqueous polyurethane resin having both a radiation curable ethylenic unsaturated double bond and a group of a salt, and the coating film thereof is cured by a radiation and the solvent resistance is enhanced as the acryloyl group concentration and crosslinking degree increase. However, there is such a drawback that the adhesion and the workability are deteriorated as the crosslinking degree increases. With respect to the solvent resistance, a group of a salt and a polar group must be introduced to obtain an aqueous resin composition, resulting in high polarity of the chemical composition itself. Even if the crosslinking degree of the composition is considerably increased, it is difficult to obtain the resistance to a polar solvent, particularly ethanol.

If the crosslinking degree is increased to obtain the solvent resistance, it is impossible to cope with a more severe situation, for example, application where high workability in drawing of a metal plate as well as adhesion are required.

Japanese Unexamined Patent Application, First Publication No. Hei 10-298213 suggests, as a composition having good stability of an emulsion and good adhesion to a base material, a radiation curable emulsion containing a radiation curable emulsifier which has a polymerizable double bond and also has an anionic hydrophilic group such as carboxyl group, phosphate group, carboxylic acid salt group, phosphate salt group or the like. However, the resulting emulsion type composition is not homogenized at a molecular level on formation of a coating film and localization of the component inevitably occurs, thus resulting in poor physical properties such as surface smoothness and gloss of the coating film as well as poor solvent resistance and poor chemical resistance. Since Newtonian flow does not occur, the resulting coating composition is inferior in coatability during roll coating as compared to a water-soluble type coating composition.

In the case in which a coated metal material is welded, the electrical resistance increases and the voltage drop becomes severe when a coating film has a large thickness at the joint portion. Therefore, an applied voltage required to welding must be enhanced. Even when using a conventional coating composition, a problem of the voltage drop is solved by reducing the thickness of the coating film to several microns or less. On the other hand, the solvent resistance of the coating film and the adhesion to the surface of the metal material are drastically deteriorated, thus resulting in poor workability in the post-processing of the coated metal material.

Although various measures have hitherto been suggested to improve the drawbacks described above, there has never been obtained a radiation curable aqueous coating composition which can form a coating film having both excellent adhesion and excellent solvent resistance in the case in which a thin film having a thickness of several microns is formed on the surface of a metal material using the coating composition. Also no coated metal material was known which was capable of being welded at the joint portion of the surface of a metal material in the state of having a thin coating film having both excellent adhesion and excellent solvent resistance.

DISCLOSURE OF INVENTION

An object of the present invention is to provide a radiation curable aqueous coating composition for forming a coating film which is a thin film and has both excellent adhesion and excellent solvent resistance, particularly ethanol resistance. Another object of the present invention is to provide a coated metal material with a coating film, which is a thin film and has both excellent adhesion and excellent solvent resistance, particularly ethanol resistance, and a manufacturing method therefor. Still another object of the present invention is to provide a method for joining a coated metal material by welding in the state of having a coating film.

The present inventors have researched intensively and have found that the problems described above can be solved by a radiation curable aqueous coating composition comprising an aqueous resin having a specific phosphate group, a specific a phosphate compound, and a specific aqueous resin, thus completing the present invention.

First, the present invention provides a radiation curable aqueous coating composition including an aqueous resin having a chemically bonded phosphate group and an ethylenic unsaturated double bond which is at least one aqueous resin selected from aqueous polyurethane resin, aqueous acrylic resin, aqueous polyester resin, and aqueous epoxy resin (hereinafter referred to as an aqueous resin (I)), and/or a mixture of an aqueous resin having both an ethylenic unsaturated double bond and a group of a salt (hereinafter referred to as an aqueous resin (II)) and a phosphate compound having an ethylenic unsaturated double bond (hereinafter referred to as a phosphate compound (III))).

Second, the present invention provides a coated metal material comprising a metal material and a radiation curable coating film formed on the metal material, wherein the coating film has a phosphate group bonded chemically to the aqueous resin and has a thickness of 3 μm or less.

Third, the present invention provides a method for manufacturing a coated metal material comprising a metal material and a radiation curable coating film formed on the metal material, which comprises the steps of coating the surface of the metal material with an aqueous coating composition comprising an aqueous resin (I), and/or a mixture of a phosphate compound (III) and an aqueous resin (II) in a coating film thickness of 3 μm or less, and curing the coating film with radiation.

Fourth, the present invention provides a method for joining a coated metal material comprising a metal material and a radiation curable coating film formed on the metal material, which comprises joining the coated metal material, the coating film of which has a phosphate group bonded chemically to the aqueous resin and has a thickness of 3 μm or less, by welding in the state of having the coating film.

Consequently, it is made possible to provide (1) a radiation curable aqueous coating composition having excellent solvent resistance and excellent adhesion to the surface of a metal material, (2) a coated metal material having a coating film, which has a dry film thickness of 3 μm or less and has excellent solvent resistance and excellent adhesion to the surface of a metal material, on the surface of a metal material, (3) a method for manufacturing the coated metal material, and (4) a method for joining a coated metal material, capable of joining by welding without removing a coating film on the surface of the coated metal material, that is, in the state of having the coating of 3 μm or less in thickness.

BEST MODE FOR CARRYING OUT THE INVENTION

First, the radiation curable aqueous coating composition of the present invention will now be described in detail. The radiation curable aqueous coating composition of the present invention contains aqueous resin (I), and/or a mixture of an aqueous resin (II) and a phosphate compound (III). As used herein, the radiation refers to energy beams such as ultraviolet light, visible light, electron beams, X-rays or the like.

The aqueous resin (I) or aqueous resin (II) used in the radiation curable aqueous coating composition of the present invention is an aqueous resin which is dissolved in water, dispersed in water, dispersible in water, or provided with a water diluting property. The aqueous resin includes, for example, an aqueous resin wherein an ion repulsive force of molecules is enhanced by neutralizing a group of a salt in a molecule, thereby dispersing microparticles in water in a molecular level, or a resin in the form of resin particles wherein particles containing molecules, which neutralized a group of a salt, are self-dispersed in water by repulsion of ions in the state of being dispersible in water, being dispersed in water, or being dispersed in a solvent prepared by optionally mixing water with an organic solvent. Specific examples of these aqueous resins are disclosed, for example in Japanese Unexamined Patent Application, First Publication No. Hei 10-251360, Japanese Unexamined Patent Application, First Publication No. Hei 10-251361, Japanese Unexamined Patent Application, First Publication No. Hei 8-259888, or Japanese Unexamined Patent Application, First Publication No. Hei 9-31150.

Examples of the resin include aqueous polyurethane resin, aqueous acrylic resin, aqueous polyester resin and aqueous epoxy resin. Preferred examples of the compound used to introduce an ethylenic unsaturated double bond into these aqueous resins are (meth)acrylate having a double bond at the α- and β-positions; monoester and diester of itaconic acid; vinyl ethers; unsaturated dicarboxylic acids such as maleic acid and fumaric acid; and monoesters or diesters thereof. As the aqueous resin (I) or aqueous resin (II), an aqueous polyurethane resin having excellent pliability on formation of a coating film and excellent adhesion to the surface of a metal material is preferably used.

The coating film of the radiation curable aqueous coating composition of the present invention has a structure such that the aqueous resin in the coating film is crosslinked and a phosphate group is chemically bonded to the resin. The aqueous resin (I) can have the above structure even when using it alone. On the other hand, when using the aqueous resin (II) alone, the phosphate group does not exist in the structure. When using the phosphate compound (III) alone, the resulting coating film is superior in performance because of poor coating film-forming ability. Accordingly, the aqueous resin (II) and the phosphate compound (III) are mixed, or are mixed with the aqueous resin (I) when using them. Since any of the aqueous resin (I), aqueous resin (II) and phosphate compound (III) has an ethylenic unsaturated double bond in a molecule, any combination of thereof can have the above structure when two or more of them are mixed. In order to obtain high adhesion and excellent solvent resistance, the content of the phosphate group in the aqueous coating composition is preferably within a range from 0.1 to 10.0% by weight, and more preferably from 0.2 to 5% by weight, in terms of phosphorus atoms based on the nonvolatile content.

As the solvent used in the radiation curable aqueous coating composition of the present invention, an organic solvent capable of dissolving the aqueous resin (I), aqueous resin (II) and phosphate compound (III) can be optionally selected, in addition to water. The content of the organic solvent in the radiation curable aqueous coating composition is preferably 5% by weight or less in aspects of safety and health as well as less environmental pollution.

The phosphate compound (III) used in the radiation curable aqueous coating composition of the present invention is a compound having one or more ethylenic unsaturated double bonds in a molecule, and examples thereof include phosphoric acid alkyl ester, phosphoric acid allyl ester and phosphoric acid aralkyl ester, each having an ethylenic unsaturated double bond in the same molecule. More specific examples are reaction products of phosphoric acid (meth)acrylate represented by the following general formula (1), i.e., phosphoric acid monoester or phosphoric acid diester, and alkyl monoglycidyl ethers, alkyl glycidyl ester or a polyepoxy compound, reaction products of a compound having both an epoxy group and an ethylenic unsaturated double bond (e.g., glycidyl methacrylate) and phosphoric acid, phosphoric acid monoester or phosphoric acid diester, and phosphoric acid polyether (meth)acrylate represented by the following general formula (2). Phosphoric acid (meth)acrylate represented by the general formula (1) is particularly preferred.

General formula (1)

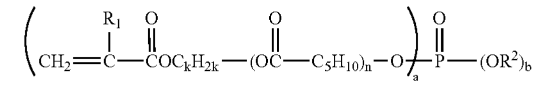

$R^1$ = —H, —$CH_3$ $R^2 = C_mH_{2m+1}$ k = 2~12, m = 0~8, n = 0~2, a = 1~3, b = 0~2

General formula (2)

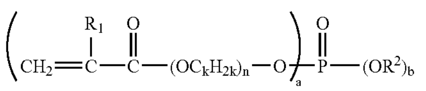

$R^1$ = —H, —$CH_3$ $R^2 = C_mH_{2m+1}$ k = 2~4, m = 0~8, n = 1~10, a = 1~3, b = 0~2

Typical examples of the phosphoric acid (meth)acrylate represented by the general formula (1) include compound obtained by dehydration condensation of phosphoric acid, 2-hydroxyethyl acrylate and 2-hydroxyethyl methacrylate, and dehydrated condensate of a compound obtained by ring-opening addition of ε-caprolactone to 2-hydroxyethyl acrylate or 2-hydroxyethyl methacrylate and phosphoric acid.

Typical examples of the phosphoric acid polyether (meth) acrylate represented by the general formula (2) include compounds obtained by dehydration condensation of an adduct such as ethylene oxide, propylene oxide or tetrahydrofuran to acrylic acid, methacrylic acid, 2-hydroxyethyl acrylate or 2-hydroxyethyl methacrylate and phosphoric acid.

The radiation curable aqueous coating composition containing the phosphate compound (III) and the aqueous resin (II) having both an ethylenic unsaturated double bond and a group of a salt is obtained by mixing the phosphate compound (III) with the aqueous resin (II) having both an ethylenic unsaturated double bond and a group of a salt, which can be dissolved or dispersed in water, a hydrophilic organic solvent, or a mixed solvent thereof. The phosphate compound (III) is preferably neutralized with a basic compound so as to obtain a radiation curable aqueous coating composition having good storage stability, which causes neither white turbidity nor precipitation.

The phosphate group bonded chemically to the aqueous resin may be phosphoric monoester, phosphoric diester or phosphoric triester. Examples of the group which is not bonded to the aqueous resin include hydrogen, alkyl ester, allyl ester and aralkyl ester. With respect to introduction of the phosphate group into the aqueous resin (II), in the case in which the aqueous resin (II) is an acrylic resin, the phosphate group bonded chemically to the aqueous resin can be introduced into the acrylic resin by copolymerizing phosphoric acid (meth)acrylate with other acrylic monomers. In the case in which the aqueous resin (II) is an epoxy resin, the phosphate group bonded chemically to the epoxy resin can be introduced by reacting the epoxy group with phosphate or phosphoric acid. In the case in which the aqueous resin (II) is a polyester resin or a polyurethane resin, the phosphate group bonded chemically to the polyester resin or polyurethane resin can be introduced by reacting each hydroxyl group with phosphorus pentaoxide. The aqueous resin (I) can be obtained by introducing an ethylenic unsaturated double bond into each resin by a publicly known method before or after introducing the phosphate group.

A portion or all of phosphoric acid groups in the radiation curable aqueous coating composition can be neutralized with a basic compound before use.

By further adding a conventionally known silane coupling agent to the aqueous resin (I), and/or the mixture of an aqueous resin (II) and a phosphate compound (III) to the above-described radiation curable aqueous coating composition of the present invention, higher adhesion between the coating film formed by coating the surface of the metal material with the radiation curable aqueous coating composition and the surface of the metal material can be obtained.

In addition to the aqueous resin (I), and/or the mixture of the aqueous resin (II) and the phosphate compound (III) or the silane coupling agent, additives and auxiliaries, for example, radiation curable monomers, radiation curable oligomers, publicly known polymerization initiators for radiation curing, publicly known resin compositions, aminoplasts, diluents, surfactants, plasticizers, waxes, hydrolysis inhibitors, emulsifiers, leveling agents, defoamers, antioxidants and antibacterial agents can be optionally incorporated into the above-described radiation curable aqueous coating composition of the present invention. If necessary, inorganic powders such as silica powders and alumina, colorants such as publicly known dyes and pigments, rust preventives and rust prevention pigments can be incorporated.

(Polyurethane Resin)

Typical examples of the aqueous polyurethane resin having an ethylenic unsaturated double bond {hereinafter referred to as an aqueous polyurethane resin (II-U)} include aqueous polyurethane resin having both an ethylenic unsaturated double bond and a group of a salt, which is dissolved or dispersed in water. According to a typical method for manufacturing the aqueous polyurethane resin (II-U), first, compounds (a) having a group of a salt, polyisocyanate compounds (b) which are difunctional or of higher functionality and polyol compounds (c) are incorporated such that excess isocyanate groups are introduced to obtain an isocyanate group-terminated polyurethane prepolymer. Then, the isocyanate group-terminated polyurethane prepolymer is reacted with radiation curable compounds (d) having one or two hydroxyl groups and one or more ethylenic unsaturated double bond, thus making it possible to obtain a polyurethane prepolymer having a radiation curable ethylenic unsaturated double bond and a group of a salt, which is terminated with an ethylenic unsaturated double bond or an isocyanate group. Then, a mixed solution of water and an organic solvent is prepared by neutralizing the group of a salt in the polyurethane prepolymer having a radiation curable ethylenic unsaturated double bond and a group of a salt at 50° C. or lower and dispersing an ionized neutralized solution in water. If necessary, a crosslinking agent (e) dissolved in water or an organic solvent is added at 30° C. or lower. According to another method of crosslinking or chain-extending using the crosslinking agent (e), the crosslinking agent (e) is previously dissolved in an aqueous phase and then an ionized neutralized solution is dispersed in water to prepare a mixed solution of water and an organic solvent. Finally, the organic solvent is distilled off from the mixed solution of water and an organic solvent under reduced pressure, thus making it possible to obtain an aqueous polyurethane resin (II-U) having radiation curability.

By using dicyclohexylmethane-4,4'-diisocyanate (hereinafter referred to as hydrogenated MDI) as a portion or all of polyisocyanate compounds (b) which are difunctional or of higher functionality, an aqueous polyurethane resin using hydrogenated MDI {hereinafter referred to as an aqueous polyurethane resin (II-U-H)} can be obtained and is used particularly preferably in view of the solvent resistance. The ratio of the hydrogenated MDI to the whole polyisocyanate is preferably 25% by weight or more.

The aqueous polyurethane resin having a chemically bonded phosphate group and an ethylenic unsaturated double bond {hereinafter referred to as an aqueous polyurethane resin (I-U)} can be obtained by replacing a portion of compounds (a) having a group of a salt and polyol compounds (c) described in the passage in the above description with respect to the aqueous polyurethane resin (I-U) by a reaction product of adding 2 moles of phosphoric acid (meth)acrylate represented by the general formula (1) to 1 mole of diglycidyl ethers such as ethylene glycol diglycidyl ether, propylene glycol diglycidyl ether, neopentyl glycol diglycidyl ether, 1,6-hexanediol diglycidyl ether or the like. Furthermore, the ethylenic unsaturated double bond concentration of the aqueous polyurethane resin (I-U), aqueous polyurethane resin (II-U) and aqueous polyurethane resin (II-U-H) is preferably from 1 to 5 eq./kg.

The reaction between the hydroxyl group and the isocyanate group can be conducted in the absence of a solvent or in a solvent, which does not react with the isocyanate group, at a temperature within a range from 20 to 120° C. In the reaction, publicly known polymerization inhibitors and reaction catalysts can be optionally added in a proper amount. After the completion of the reaction between the hydroxyl group and the isocyanate group, various resins, additives and auxiliaries, for example, radiation curable resins, polymerization initiators for radiation curing, radiation curable monomers, radiation curable oligomers, publicly known resin compositions, amino-plasts, diluents, surfactants, plasticizers, waxes, hydrolysis inhibitors, emulsifiers, leveling agents, defoamers, antioxidants and antibacterial agents can be optionally incorporated.

These additives can be added in the preparation of the coating, but can be mixed easily with a water-insoluble compound by introducing them before phase inversion into water in the preparation of the aqueous phase used in the present invention, as disclosed in Japanese Unexamined Patent Application, First Publication No. Hei 8-259888.

As the compounds (a) having a group of a salt, i.e., a group capable of forming a salt, for example, diols having as a group of a salt any of phosphate group, sulfonic acid group, N,N-di-substituted amino group, carboxyl group, neutralized phosphate group, neutralized sulfonic acid group, neutralized N,N-disubstituted amino group and neutralized carboxyl group, and diamines are suited. Specific examples thereof include polyester diol wherein at least a portion of trimethylolpropanemonophosphate, trimethylolpropanemonosulfuric acid ester and a dibasic acid component is sodium sulfosucciniate or sodium sulfoisophthalate; and carboxyl group-containing polycaprolactonediol wherein a lactone compound such as ϵ-caprolactone is added to N-methyldiethanolamine, diaminocarboxylic acids (e.g., lysine, cystine and 3,5-diaminocarboxylic acid), dihydroxyalkylalkanoic acid (e.g., 2,6-dihydroxybenzoic acid and 3,5-dihydroxybenzoic acid, 2,2-bis(hydroxymethyl)propionic acid, 2,2-bis(hydroxyethyl)propionic acid, 2,2-bis(hydroxypropyl)propionic acid, bis(hydroxymethyl)acetic acid and 2,2-bis(hydroxymethyl)butanoic acid), bis(4-hydroxyphenyl)acetic acid, 2,2-bis(4-hydroxyphenyl)pentanoic acid, tartaric acid, N,N-dihydroxyethyl glycine, N,N-bis(2-hydroxyethyl)-3-carboxy-propionamide, or dihydroxyalkylalkanoic acid. To improve the compatibility, polyethylene glycol containing a hydrophilic molecular chain having three or more repeating units of ethylene can be used in combination with the compound having a group of a salt.

The requisite amount of the group of a salt can be appropriately decided according to the kind and composition ratio of the components. Among the examples described above, compounds having any one or two groups selected from a carboxyl group and a sulfonic acid salt group, or a mixture thereof. It is particularly preferred to introduce a carboxyl group because good balance can be easily attained in various aspects. The acid value of the aqueous polyurethane resin (II-U) and the aqueous polyurethane resin (II-U-H) is preferably within a range from 20 to 100 KOH mg/g, and more preferably from 25 to 60 KOH mg/g.

Examples of the polyisocyanate compounds (b) which are difunctional or of higher functionality include aliphatic diisocyanates such as 1,6-hexamethylene diisocyanate, 2,2,4-trimethylhexamethylene diisocyanate, and lysine diisocyanate; aliphatic polyisocyanates such as trimer of the aliphatic isocyanate, and adduct of a low-molecular triol and the aliphatic isocyanate; alicyclic diisocyanates such as isophorone diisocyanate, hydrogenated MDI, methylcyclohexylene diisocyanate, isopropylidene cyclohexyl-4,4'-diisocyanate, and norbornene diisocyanate; alicyclic polyisocyanates such as trimer of the alicyclic diisocyanate, and adduct of a low-molecular triol and the alicyclic isocyanate; aromatic-aliphatic diisocyanates such as xylylene diisocyanate; aromatic-alicyclic polyisocyanates such as trimer of xylylene diisocyanate, and adduct of a low-molecular triol and the aromatic-aliphatic isocyanate; aromatic diisocyanates such as 4,4'-diphenylmethane diisocyanate and tolylene diisocyanate; aromatic polyisocyanates such as triphenylmethane triisocyanate, trimer of the aromatic diisocyanate, and adduct of a low-molecular triol and the aromatic isocyanate; polyisocyanates which are trifunctional or of higher functionality, such as polymethylphenylenepolyphenyl isocyanate; and polyisocyanates compounds having a carbodiimide group, such as "COSMONATE LL" (mixture of carbodiimidated 4,4'-diphenylmethane diisocyanate and 4,4'-diphenylmethane diisocyanate manufactured by Mitsui Chemicals, Inc.) and "CARBODILITE V-05" (terminated aliphatic polyisocyanate compound having a polycarbodiimide group, manufactured by NISSHINBO INDUSTRIES, Inc.); and two or more polyisocyanate compounds can be used in combination.

Examples of the polyol compounds (c) include ethylene glycol, propylene glycol, diethylene glycol, cyclohexane-1,4-dimethanol, 1,3-butylene glycol, 1,4-butylene glycol, neopentyl glycol, 1,6-hexanediol, 3-methyl-1,5-pentanediol, 2-ethyl-1,3-hexanediol, 2-butyl-2-ethyl-1,3-propanediol, 2-methyl-1,8-octanediol, 1,9-nonanediol, cyclohexyl dimethanol, bisphenol A, bisphenol F, hydrogenated bisphenol A, hydrogenated bisphenol F, castor oil-modified diol, and castor oil-modified polyol.

Furthermore, polymeric polyols such as polyester polyol, polycarbonate polyol and polyether polyol can be mentioned as preferred polymeric polyols. The molecular weight is preferably within a range from 500 to 5,000 in terms of number-average molecular weight.

Examples of the polyester polyol include polyols obtained by the addition reaction of one or more monoepoxy compounds selected from alkyl monoglycidyl ethers such as ethyl glycidyl ether, methyl glycidyl ether, butyl glycidyl ether, 2-ethylhexyl glycidyl ether, lauryl glycidyl ether, decyl glycidyl ether and stearyl glycidyl ether or alkyl glycidyl ester (manufactured by Shell Japan Ltd., under the trade name of "Cardula E10") and one or more polybasic acids or acid anhydrides {hereinafter referred to as a polybasic acid (f)} selected from aliphatic dibasic acids such as adipic acid, azelaic acid, sebacic acid and dimer acid, or aromatic polybasic acids, or anhydrides thereof such as isophthalic acid, terephthalic acid and trimellitic anhydride, or alicyclic polybasic acids or anhydrides thereof such as hydrophthalic anhydride and dimethyl-1,4-cyclohexanedicarboxylic acid, and polyester polyols obtained by condensation reaction with the polybasic acid (f), in addition to the polyols described above. Furthermore, polyester polyols obtained by the ring-opening polymerization of ϵ-caprolactone and β-methyl-δ-varelolactone.

Examples of the polycarbonate polyol include hexamethylene polycarbonate polyol obtained from 1,6-hexanediol as a raw material, polycarbonate diol made of 1,4-butylene glycol, polycarbonate diol made of neopentyl glycol, polycarbonate diol made of 3-methyl-1,5-pentanediol, and polycarbonate diol made of 1,9-nonanediol.

Specific examples of the polyether polyol include polyalkylene glycols such as polyethylene glycol, polypropylene glycol and polytetramethylene glycol.

Examples of the compounds having 1 or 2 hydroxyl groups and one or more ethylenic unsaturated double bonds include monohydroxy mono(meth)acrylates such as 2-hydroxyethyl (meth)acrylate, 2-hydroxypropyl (meth)acrylate and hydroxybutyl (meth)acrylate; monohydroxyacryl methacrylates such as glycerin di(meth)acrylate and "LIGHT-ESTER G-201P" (manufactured by KYOEISHA CHEMICAL CO., LTD.); monohydroxy triacrylates such as pentaerythritol triacrylate; monohydroxy pentaacrylates such as dipentaerythritol pentaacrylate; dihydroxy mono (meth)acrylates such as glycerin mono(meth)acrylate; and compounds obtained by the addition polymerization of these compounds with ethylene oxide, propylene oxide, tetrahydrofuran or ε-caprolactone.

Further examples thereof include products obtained by the Michael addition reaction of polyfunctional acrylates such as trimethylolpropane triacrylate, pentaerythritol tetraacrylate and dipentaerythritol hexaacrylate and dialkanolamines such as diethanolamine, diisopropanolamine, dipropanolamine and dibutanolamine or monoalkylalkanolamines such as methylethanolamine, ethylethanolamine and methylpropanolamine; half urethanes obtained by reacting diisocyanates contaning two isocyanate groups having different reactivities, such as isophorone diisocyanate and tolylene diisocyanate with monohydroxy monoacrylate and mobnohydroxy di(meth)acrylate; and products obtained by reacting methaeryl isocyanate with dialkanolamines or monoalkylmonoalkanolamines.

In the reaction of introducing a group having an ethylenic unsaturated double bond into the aqueous resin, or the other reaction after introducing the group having an ethylenic unsaturated double bond, polymerization inhibitors such as hydroquinone, tert-butyl-hydroquinone and methoquinone are preferably used.

In the preparation of the aqueous polyurethane resin (I-U) and aqueous polyurethane resin (II-U), a conventionally known urethanization catalyst such as dibutyltin dilaurate, stannous octoate, triethylamine, N,N-dimethylbenzylamine, sodium hydroxide, diethylzinctetra(n-butyl)titanium or the like is optionally used. The reaction solvent is preferably reacted in an organic solvent which is inert to an isocyanate group, and examples thereof include acetone, methyl ethyl ketone, ethyl acetate, dioxane, acetonitrile, tetrahydrofuran, benzene, toluene, xylene, monoglyme, diglyme, dimethyl sulfoxide and N-methylpyrrolidone. These reaction solvents can be used alone or in combination.

Examples of the crosslinking agent (e) include aliphatic amine such as ethylenediamine, piperazine, N-aminoethylpiperazine, hexamethylenediamine, hydrazine, diethyltriamine, triethylteramine or tetraethylenepentamine; alicyclic amine such as cyclohexylenediamine, isophoronediamine or norbomanediaminoethyl; aromatic amine such as tolylenediamine, xylenediamine, phenylenediamine, tris(2-aminoethyl)amine or 2,6-diaminopyridine; and aminosilane such as γ-aminopropyltrimethoxysilane, γ-diaminopropyltriethoxysilane, N-β-(aminoethyl)-γ-aminopropyltrimethoxysilane or N-β-(aminoethyl)-γ-aminopropylmethyldimethoxysilane. Examples of the ketimine compound include ketimine compounds produced by dehydration of primary amine such as dimaine or triamine and isobutyl ketone.

Examples of the basic compound (g) capable of neutralizing the group of a salt, the phosphate group, or the phosphate compound (III) and the phosphoric acid (meth) acrylate represented by the general formula (1) include alkylalkanolamines such as trimethylamine, triethylamine, trialkylamines, dimethylmonoethanolamine, diethylethanolamine and diethanolmonomethylamine; and basic vinyl monomers such as dimethylaminoethyl methacrylate and diethylaminoethyl methacrylate.

(Acrylic Resin)

The aqueous acrylic resin used in the radiation curable aqueous coating composition of the present invention refers to an aqueous resin containing, as an indispensable component, an acrylic monomer such as (meth)acrylic acid or an ester thereof, and may be an unsaturated dibasic acid such as vinyl ether, styrene or maleic anhydride, or a copolymer with an ester thereof.

A typical method of preparing an aqueous acrylic resin having a chemically bonded phosphate group and an ethylenic unsaturated double bond {hereinafter referred to as an aqueous acrylic resin (I-A)} includes, for example, the following method. Using the phosphoric acid (meth)acrylate represented by the general formula (1) and (meth)acrylic acid as an indispensable component, a (meth)acrylic acid alkyl ester such as methyl methacrylate, ethyl (meth)acrylate, propyl (meth)acrylate or butyl (meth)acrylate, a (meth) acrylic acid ester such as isobornyl (meth)acrylate or cyclohexyl (meth)acrylate and a monomer copolymerizable with these compounds are copolymerized by a publicly known solution polymerization or suspension polymerization method. In this case, the amount of the phosphoric acid (meth)acrylate represented by the general formula (1) or the monomer having a group of a salt such as (meth)acrylic acid is appropriately controlled so that the resulting polymer is made water-soluble by neutralization. After the completion of the copolymerization, the resulting acrylic copolymer solution is sufficiently heated, thereby completely descomposing a thermal polymerization initiator used in the copolymerization. Then, 1000 ppm of a polymerization inhibitor such as methoquinone or hydroquinone is added to the acrylic copolymer solution and a publicly known arbitrary amount of a ring-opening catalyst is optionally added. Furthermore, glycidyl (meth)acrylate is reacted with a carboxyl group of the acrylic copolymer at 80 to 100° C. so that the ethylenic unsaturated double bond concentration becomes 1 to 5 eq./kg, thereby introducing a (meth)acryloyl group into the acrylic copolymer. With respect to the content of the carboxyl group in the acrylic copolymer, the amount of the (meth)acrylic acid is controlled so that the acid value finally reaches 20 to 100 KOH mg/mg, and preferably 25 to 60 KOH mg/mg, after the reaction with glycidyl (meth) acrylate. The acrylic copolymer into which the acryloyl group is introduced is neutralized with the basic compound (g) to obtain a desired aqueous acrylic resin (I-A).

A (meth)acryloyl group can be introduced into a hydroxyl group of an acrylic resin having a hydroxyl group, a carboxyl group and a phosphate group, which can be obtained by copolymerizing with a monomer having a hydroxyl group such as hydroxypropyl (meth)acrylate, in addition to the above monomer, by a publicly known method. For example, the aqueous acrylic resin (I-A) can also be obtained by reacting a portion or all of hydroxyl groups of the copolymer with (meth)acrylic acid chloride, washing the reaction solution with water to remove hydrochloric acid as by-product, or reacting with (meth)acrylic anhydride and washing the reaction solution with water to remove (meth) acrylic acid as by-product.

An aqueous acrylic resin having an ethylenic unsaturated double bond {hereinafter referred to as an aqueous acrylic resin (II-A)} can be prepared by the same method as in case of the aqueous acrylic resin (I-A), except that the phosphoric acid (meth)acrylate represented by the general formula (1) is not incorporated.

Another method of preparing the aqueous acrylic resin (II-A) includes, for example, the following method. A portion or all of an acid anhydride of an acrylate-styrene-maleic anhydride tercopolymer resin is reacted with primary amine. A (meth)acryloyl group can be introduced by the Michael addition reaction of the imino group obtained by this reaction and a polyfunctional polyacrylate, thus obtaining an acrylic resin. The carboxyl group in the resin is neutralized with the basic compound (g) to obtain an aqueous acrylic resin (II-A). The amount of the carboxyl group can be controlled by reacting a portion or all of the acid anhydride with a lower alcohol.

(Polyester Resin)

A typical method of preparing an aqueous polyester resin having an ethylenic unsaturated double bond {hereinafter referred to as an aqueous polyester resin (II-P)} includes, for example, the following method. A polyester resin having a group of a salt such as carboxyl group on a side chain and a hydroxyl group at a molecular terminal is obtained by dehydration condensation of one or more compounds selected respectively from compounds (a) having a group capable of forming a salt such as dimethylolalkanoic acid, polyols (c) and polybasic acid (f). A (meth)acryloyl group is introduced into a portion of the resulting hydroxyl groups by a publicly known method. Examples of the introduction method include a method of reacting with (meth)acrylic acid chloride and washing the reaction solution with water to remove hydrochloric acid as by-product, a method of reacting a portion or all of the resulting hydroxyl groups with (meth)acrylic anhydride and washing the reaction solution with water to remove (meth)acrylic acid as by-product, and a method of introducing a (meth)acryloyl group into a hydroxyl group at molecular terminal of a polyester resin at reflux with toluene using (meth)acrylic acid. In case the group of a salt of the polyester resin having an ethylenic unsaturated double bond is a carboxyl group, an aqueous polyester resin (II-P) is obtained by neutralizing a portion of all of carboxyl groups with the basic compound (g). The reaction can be conducted by adding publicly known polymerization inhibitors. The acid value of the aqueous polyester resin (II-P) is preferably within a range from 20 to 100 KOH mg/g.

A typical method of preparing an aqueous polyester resin having a chemically bonded phosphate group and an ethylenic unsaturated double bond {hereinafter referred to as an aqueous polyester resin (I-P)} includes, for example, the following method. First, a (meth)acryloyl group is introduced into a polyester resin having a hydroxyl group at a molecular terminal. In this case, hydroxyl groups are left in an amount required to the following introduction of a phosphate group. Using diphosphorous pentaoxide, a phosphate group is introduced into the remaining hydroxyl groups in the polyester resin. Then, an aqueous polyester resin (I-P) is obtained by neutralizing a portion of all of carboxyl groups and phosphoric acid groups of the polyester resin with the basic compound (g). The acid value of the aqueous polyester resin (I-P) is preferably within a range from 20 to 100 KOH mg/g.

(Epoxy Resin)

A typical method of preparing an aqueous epoxy resin having a chemically bonded phosphate group and an ethylenic unsaturated double bond {hereinafter referred to as an aqueous epoxy resin (I-E)} is as follows. First, diphosphorous pentaoxide is added to hydroxyl groups of a publicly known arbitrary epoxy acrylate wherein (meth)acrylic acid is added to epoxy groups of an epoxy resin, and phosphate groups are introduced to obtain an epoxy resin. Then, an aqueous epoxy resin (I-E) is obtained by neutralizing a portion of all of phosphoric acid groups of the epoxy resin with the basic compound (g). The amount of phosphoric acid groups to be introduced is preferably from 15 to 60 mg/g in terms of phosphorous atoms. The amount is preferably controlled so that the acid value of the aqueous epoxy resin (I-E) becomes 20 to 100 KOH mg/g, and more preferably 25 to 60 KOH mg/g.

A typical method of preparing an aqueous epoxy resin having an ethylenic unsaturated double bond {hereinafter referred to as an aqueous epoxy resin (II-E)}is as follows. First, polybasic anhydride is added to hydroxyl groups of a publicly known arbitrary epoxy acrylate wherein (meth) acrylic acid is added to epoxy groups of an epoxy resin, and carboxyl groups are introduced. Then, an aqueous epoxy resin (II-E) is obtained by neutralizing a portion of all of carboxyl groups of the epoxy resin with the basic compound (g). The amount of carboxyl groups to be introduced is preferably controlled so that the acid value of the aqueous epoxy resin (II-E) becomes 20 to 100 KOH mg/g, and more preferably 25 to 60 KOH mg/g.

(Coated Metal Material)

The coated metal material of the present invention, comprising a metal material and a radiation curable coating film formed on the metal material, wherein the coating film has a phosphate group bonded chemically to the aqueous resin and has a thickness of 3 μm or less, will now be described.

Examples of the metal material include steel materials such as steel material, metal-coated steel material and non-metal-coated steel material; and non-ferrous metal materials such as titanium, copper, magnesium, aluminum, and material obtained by these materials with metals or non-metals. Examples of the metal-coated steel include metallized steel material and metal-plated steel material. It also includes metal materials obtained by plating or metallizing using a metal in which inorganic or organic matter is dispersed.

When using the steel material wherein the metal material is coated with zinc, an alloy of zinc, and other metal, or is coated with zinc by a metallizing or plating process, it is made possible to obtain a coated metal material having a surface hardness of the coating film, excellent adhesion to the surface of the metal material and excellent workability. The metal material may be a metal material with an inorganic coating film on the surface or a metal material with no inorganic coating film, but the metal material with no inorganic coating film is preferred because of high adhesion to the metal material and high solvent resistance of the coating film as an object of the present invention. As used herein, the inorganic coating film means an inorganic coating film formed on the metal surface by a chromate treatment and does not mean a metal coating by a plating or metallizing process.

The coating film of the coated metal material of the present invention is a coating film cured by crosslinking due to irradiation with radiation, which has a phosphate group bonded chemically to an aqueous resin and has a film thickness of 3 μm or less after curing. The radiation curable aqueous coating composition for forming the coating film on the surface of the metal material may be any one having a phosphate group bonded chemically to an aqueous resin. Preferably, when using a radiation curable aqueous coating composition containing an aqueous resin (I), and/or a mixture of a phosphate compound (III) and an aqueous resin (II), a coating film having excellent solvent resistance of the coating film and excellent adhesion to the surface of the metal material can be obtained.

The coated metal material of the present invention is used for various purposes, and the coating film is formed on the surface for the purpose of surface protection in view of uses in prevention for adhesion of fingerprints, lubricating steel plates, primers, and coating films requiring no top coat.

The coated metal material of the present invention is characterized in that the coating film thickness is 3 μm or less, preferably 0.5 to 2 μm, and more preferably 1 to 1.5 μm.

The thickness of the coating film may be decided according to the purpose. When the coating film is a thin film having a thickness of 3 μm or less, it exerts excellent effects in economical efficiency, adhesion in forming in post-processing, and conductivity in welding.

The thin layer having a thickness of 3 μm or less exerts excellent effects from the following points of view. That is, regarding the coating film on the coated metal material of the present invention, the phosphate group bonded chemically to the aqueous resin has the affinity or chemical bonding to the surface of the metal material and is also crosslinked by the polymerization of an ethylenic unsaturated double bond due to irradiation with radiation. In summary, the formed coating film is not only cured by the polymerization of the ethylenic unsaturated double bond due to irradiation with radiation, but is also firmly adhered due to the affinity or chemical bonding of the phosphate group to the surface of the metal material. Accordingly, the coating film can be firmly adhered to the surface of the non-treated metal, which is reactive to the phosphate group, due to the affinity or chemical bonding as compared with the surface coated with an inorganic coating film by a chromate treatment.

(Method for Manufacturing Coated Metal Material)

The method for manufacturing a coated metal material comprising a metal material and a radiation curable coating film formed on the surface of the metal material will now be described. The metal material used in the method for manufacturing a coated metal material of the present invention is not specifically limited, but various metal materials described in the description of the (coated metal material) are preferably used. As the radiation curable aqueous coating composition for forming the coating film on the surface of the metal material, for example, various radiation curable aqueous coating compositions containing the aqueous resin (I), and/or the mixture of the aqueous resin (II) and the phosphate compound (III) of the present invention are used, thus making it possible to exert excellent effects on the solvent resistance of the coating film, adhesion to the surface of the metal plate, and workability.

The method for manufacturing a coated metal material usually comprises (1) the step of removing contaminants on the metal surface, thereby improving the wettability and adhesion of the coating composition, for example, publicly known steps of alkaline degreasing, acid pickling, sand blasting, washing, hot water rinsing and polishing, (2) the step of pre-treatment for improving the wettability and adhesion of the coating composition, for example, the step of a publicly known treatment such as chromate treatment, treatment with zinc phosphate, treatment with iron phosphate, phosphating treatment, double oxide coating treatment or displacement deposition treatment of Ni or Co, or the step of treatments used in combination, (3) the step of coating or adhering the coating composition onto the surface of the metal material, (4) the drying step of evaporating the solvent in the coating composition on the surface of the metal material, (5) the heating step for accelerating the curing reaction in the coating composition, and/or (6) the step of irradiating with radiation for accelerating the curing reaction in the coating composition. In the method for manufacturing a coated metal material of the present invention, a radiation curable coating film can be formed on the surface of the metal material by using the steps (3) and (6) as indispensable steps in combination with other steps.

In the method for manufacturing a coated metal material of the present invention, wherein the coating step (3) is used as the indispensable step, various radiation curable aqueous coating compositions containing the aqueous resin (I), and/or the mixture of the aqueous resin (II) and the phosphate compound (III) of the present invention are coated with a coating film thickness of 3 μm or less. The radiation curable aqueous coating composition can be coated, for example, by a publicly known method such as roll coating, curtain coating, dip coating, spray coating, brush coating, electrodeposition coating or the like.

When the surface of the metal material is coated with the coating composition before forming an oxide film, that is, immediately after the step of rolling and plating, it becomes possible to omit (1) the step of removing contaminants on the metal surface, thereby improving the wettability and adhesion of the coating composition and (2) the step of pre-treatment for improving the wettability and adhesion of the coating composition.

The step (4) of evaporating the solvent can be conducted by a publicly known method such as air drying, hot-air heating, induction heating, irradiation with infrared rays and far infrared rays, ultrasonic vibrations or the like. The heating step (5) can be conducted, for example, by the method of heating the metal material used in the above step (4).

In the method for manufacturing a coated metal material of the present invention, the step (6) of irradiating with radiation is used as the indispensable step and the heating step (5) can be omitted. Regarding the coating film of the radiation curable aqueous coating composition, the resin in the coating film is cured by crosslinking due to irradiation with radiation such as ultraviolet light, visible light, electron beam, X-ray or the like. The radiation is preferably ultraviolet light or electron beam which is used widely.

In the case in which the coating film is cured by irradiation with electron beam, polymerization initiators are not required. The coating film can be obtained by irradiating with electron beam of a total dose of 5 to 200 kGy, preferably 10 to 100 kGy, using an electron irradiating apparatus of an acceleration voltage of 20 to 2000 KeV, preferably 150 to 300 KeV.

In the case in which the coating film is irradiated with ultraviolet light, a mercury lamp or xenon lamp widely used as a light source is used. In this case, photopolymerization initiators are added to the radiation curable aqueous coating composition. The photopolymerization initiator can be arbitrary selected from publicly known substances. The amount can also be arbitrary and is, for example, within a range from about 0.2 to 20%, and preferably from 0.5 to 10%, based on the nonvolatile content of the coating composition.

In the method for manufacturing a coated metal material of the present invention, the thickness of the coating film can be set to 3 μm or less according to the purpose. For example, for the purpose of using as fingerprint preventing steel sheet and lubricating steel sheet, the thickness is preferably within a range from 0.5 to 2 μm, and more preferably from 1 to 1.5 μm. Thus, a coating film having excellent adhesion to the surface of the metal material and excellent solvent resistance can be obtained, even through it is a thin film.

(Method for Joining Coated Metal Material)

The method for joining a coated metal material comprising a metal material and a radiation curable coating film formed on the metal material, which comprises joining the coated metal material, the coating film of which has a phosphate group bonded chemically to the aqueous resin and has a thickness of 3 μm or less, by welding in the state of having the coating film will now be described.

As the metal material with a coating film cured by radiation, which is to be joined by welding, a coated metal wherein the coating film has a phosphate group bonded chemically to the aqueous resin and has a thickness of 3 μm or less, preferably 0.5 to 2 μm, and more preferably 1 to 1.5 μm, is used. The above-described coated metal material of the present invention is preferably used. The coated metal material using the radiation curable aqueous coating composition of the present invention is particularly preferably used. The shape of the coated metal material to be welded is not specifically limited, but examples thereof include a sheet or a formed sheet such as steel sheet, a die casting article, and a metal material rolled in the shape of bar or H-steel.

The method of joining a coated metal sheet or formed coated metal material by welding includes, for example, an electrical welding method. The form of joining includes the case where a coating film exists at the joint portion and the case where no coating film exists at the joint portion but a coating film sometimes exits on the surface to be contacted with an electrode for welding. In any case, the method for joining a coated metal material of the present invention has a significant feature of joining without removing the coating film.

For example, 1 mm thick electrogalvanized steel sheets with a coating film having a thickness of 1 to 1.5 μm formed on both surfaces can be spot-welded in the state where the respective coating films are laid one upon another. Alternatively, electrogalvanized steel sheets can be spot-welded by putting an electrode on the non-coated surface in the state where coating films having a thickness of 1 to 1.5 μm formed on one surface of each electrogalvanized steel sheet are laid one upon another. As described above, the present invention exerts effects when coated metal materials are joined with each other in the state of having the coating film at the joint portion. Alternatively, electrogalvanized steel sheets can also be spot-welded by putting an electrode on the coated surface in the state where non-coated surfaces are laid one upon another.

Since the coating film cured by radiation has low conductivity, a high voltage is required when the coating film is thick in the case in which coated metal materials with the coating film formed thereon are electrically welded. The welding process causes a disadvantage in that soot is formed from the coating film portion cured by heating. In the joining method by spot welding, since the electrode is stained with soot and lamp black formed from the coating film, the number of coated metal materials which can be welded decreases with the increase of the coating film thickness. Although a conventional coating composition does not cause such a disadvantage if the coating film thickness is reduced, a function of a coating composition for protecting the metal surface is drastically lowered.

The coated metal material used in the method for joining the coated metal material of the present invention is a coated metal material having a coating film, which has a phosphate group bonded chemically to the aqueous resin and is a thin film having a thickness of 3 μm or less, but has high adhesion to the surface of the metal material and excellent solvent resistance. Since the coating film is a thin film, less voltage drop between the electrode and the coated metal material occurs in the electrical welding step, thus making it possible to reduce the amount of soot to the minimum. As a result, according to the method for joining the coated metal material of the present invention, the electrode is less likely stained with soot and lamp black formed from the coating film, and spot welding can be conducted 1000 times or more.

EXAMPLES

The present invention will now be described specifically by way of the following Examples. In [Example A], a radiation curable aqueous coating composition having a phosphate group using various aqueous resins of the present invention and a radiation curable aqueous coating composition having no phosphate group will be described. In [Example B], specific examples of a particularly excellent aqueous polyurethane coating composition in the present invention will be described. In the following Examples, "percentages" and "parts" are by weight unless otherwise indicated.

Example A

Preparation Example (1) of Aqueous Polyurethane Resin (I-U)

In a reaction vessel equipped with a reflux condenser, a nitrogen introducing tube, an air introducing tube and a thermometer, 3.2 parts of polyoxyethylene glycol (Mn=600), 42.6 parts of lactone polyester diol "OD-X-2155" (Mn=970, manufactured by DAINIPPON INK AND CHEMICALS, Inc.), 21.1 parts of 2,2-bis(dihydroxymethyl) butanoic acid, 7.1 parts of butylethylpropanediol, 22.9 parts of castor oil "LM-R" (manufactured by HOKOKU CORPORATION), 47.4 parts of hydrogenated MDI, 170.9 parts of methyl ethyl ketone and 0.02 parts of stannous octoate were added with stirring and were heated to 70° C. over 0.5 hours. After the reaction at 70 to 75° C. for three hours, 28.8 parts of hydrogenated XDI ("Takenate 600" manufactured by Takeda Chemical Industries, Ltd.) was added and the reaction was conducted again at 70 to 75° C. for one hour. Then, 0.2 parts of methoquinone, 40.3 parts of "LIGHT-ESTER G-201P" (manufactured by KYOEISHA CHEMICAL CO., LTD.) and 0.1 parts of stannous octoate were added and, after replacing a nitrogen introducing tube by an air introducing tube, the reaction was continued again at 70 to 75° C. The reaction was conducted for ten hours while adding 0.04 part of tert-butyl-hydroquinone and 0.04 parts of stannous octoate every four hours to obtain a solution of a polyurethane resin. After cooling to 30° C., 14.4 parts of trietylamine and 530 parts of pure water were added to the resulting solution. After adding 0.5 parts of "Surfinol AK02" (manufactured by NISSHIN CHEMICAL INDUSTRY Co., Ltd.), methyl ethyl ketone was distilled off under reduced pressure at 50° C. to obtain an aqueous polyurethane resin (II-U) having a nonvolatile content of 30.0%, an acid value of 39.3 KOH mg/g, a Gardner viscosity U, and an unsaturated group concentration of 1.6 eq./kg. This is referred to as an aqueous polyurethane resin (II-U-1).

Preparation Example of Aqueous Acrylic Resin (II-A)

In a reaction vessel with a stirrer, equipped with a reflux condenser, a nitrogen (containing 7 to 10% oxygen) introducing tube and a thermometer, 62.24 parts of ethyl acetate, 62.24 parts of dipentaerythritol hexaacrylate and 0.01 parts of methoquinone were charged and dissolved with stirring. After cooling to 25° C., a solution prepared previously by mixing 6.93 parts of benzylamine with 10.4 parts of ethyl acetate was added dropwise over 30 minutes. After stirring at 30° C. for three hours, a solution prepared by dissolving 30.83 parts of an ethyl acrylate-styrene-maleic anhydride copolymer resin having a weight-average molecular weight of 2,000 and an acid value of 300 KOH mg/g [manufactured by GIFU SHELLAC] in 77 parts of acetic acid was added and the reaction was conducted by heating to 60° C. for two hours. After cooling to 30° C., 6.53 parts of triethylamine was added 233.6 parts of deionized water was added, followed by stirring for 30 minutes. While maintaining at 30° C., an aqueous solution prepared previously by dissolving 2.5 parts of piperazine in 17.5 parts of deionized water was added dropwise over 30 minutes and the solution was continuously stirred at 30° C. for 2.5 hours, and then ethyl acetate was removed by distilling off under reduced pressure at 40° C. As a result, an aqueous acrylic resin (II-A) having a Gardner viscosity M-N, a nonvolatile content of 29.8%, an ethylenic unsaturated double bond concentration of 4.8 eq./kg, and an acid value of 54.7 KOH mg/g was obtained as a semitransparent liquid.

Preparation Example of Aqueous Polyester Resin (I-P)

In a reaction vessel with a stirrer, equipped with a rectifying tube for glycol, a condensed water decanter, a reflux condenser, a pure nitrogen introducing tube, a nitrogen gas mixture containing 7 to 10% oxygen introducing tube and a thermometer, 6.98 parts of ethylene glycol, 13.59 parts of 1,6-hexanediol, 16.3 parts of dimethylolbutanoic acid, 40.23 parts of trimethylolpropane, 37.05 parts of phthalic anhydride and 50.56 parts of sebacic acid were charged and nitrogen was blown, and then this was heated to 180° C. with stirring over two hours. After heating to 230° C. over three hours, the reaction was conducted at 230° C. for five hours. After cooling to 105° C. and replacing by a nitrogen gas mixture containing 7 to 10% oxygen introducing tube, 30 parts of toluene, 25.2 parts of acrylic acid and 0.17 parts of methoquinone were added and dehydration condensation was conducted at reflux with toluene at 105 to 110° C. for five hours. A polyester resin obtained under reduced pressure of 20 mmHg for one hour was diluted with 73 parts of ethyl acetate and was then cooled to 50° C. While maintaining at 50° C., 7.1 parts of diphosphorous pentaoxide diluted with 7.1 parts of ethyl acetate was added. After maintaining at 50° C. for two hours, carboxyl groups and phosphate groups were neutralized by adding 21 parts of triethylamine with cooling and 620 parts of deionized water was added, followed by solvent change and further distillation under reduced pressure at 40 to 50° C. to obtain an aqueous polyester resin (I-P) having a chemically bonded phosphoric acid group and an ethylenic unsaturated double bond. It had a Gardner viscosity U, a nonvolatile content of 30.8%, an ethylenic unsaturated double bond concentration of 2.0 eq./kg, an acid value of 64.2 KOH mg/g and a phosphorous content of 1.8%.

Preparation Example of Aqueous Polyester Resin (II-P)

In a reaction vessel with a stirrer, equipped with a rectifying tube for glycol, a condensed water decanter, a reflux condenser, a pure nitrogen introducing tube, a nitrogen gas mixture containing 7 to 10% oxygen introducing tube and a thermometer, 6.98 parts of ethylene glycol, 13.59 parts of 1,6-hexanediol, 16.3 parts of dimethylolbutanoic acid, 40.23 parts of trimethylolpropane, 37.05 parts of phthalic anhydride and 50.56 parts of sebacic acid were charged and nitrogen was blown, and this was then heated to 180° C. with stirring over two hours. After heating to 230° C. over three hours, the reaction was conducted at 230° C. for five hours. After cooling to 105° C. and replacing by a nitrogen gas mixture containing 7 to 10% oxygen introducing tube, 30 parts of toluene, 25.2 parts of acrylic acid and 0.17 parts of methoquinone were added and dehydration condensation was conducted in reflux with toluene at 105 to 110° C. for five hours. A polyester resin obtained under reduced pressure of 20 mmHg for one hour was diluted with 73 parts of ethyl acetate. Carboxyl groups were neutralized by adding 11 parts of triethylamine with cooling and 600 parts of deionized water was added, followed by solvent change and further distillation under reduced pressure at 40 to 50° C. to obtain an aqueous polyester resin (II-P) having an ethylenic unsaturated double bond. It had a Gardner viscosity M, a nonvolatile content of 30.6%, an ethylenic unsaturated double bond concentration of 2.1 eq./kg and an acid value of 41.0 KOH mg/g.

Preparation Example of Aqueous Polyepoxy Resin (I-E)

In a reaction vessel with a stirrer, equipped with a reflux condenser, a nitrogen (containing 7 to 10% oxygen) introducing tube and a thermometer, 132.0 parts of epoxy acrylate "UE-8400-M80" (manufactured by DAINIPPON INK AND CHEMICALS, Inc., MEK content of 20%), 37.5 parts of ethyl acetate and 0.1 parts of methoquinone were charged and dissolved. A solution prepared by previously mixing 5.6 parts of diphosphorous pentaoxide with the same amount of ethyl acetate was added dropwise at 50° C. over 30 minutes. After maintaining at 50° C. for three hours, the reaction solution was neutralized by adding 20 parts of triethylamine. Solvent change was conducted by adding 260 parts of deionized water. The solution was distilled under reduced pressure at 40 to 50° C. to obtain an aqueous polyepoxy resin (I-E) having a chemically bonded phosphate group and an ethylenic unsaturated double bond. It had a Gardner viscosity V, a nonvolatile content of 30.9%, an ethylenic unsaturated double bond concentration of 2.0 eq./kg, an acid value of 50.0 KOH mg/g and a phosphorous content of 6%.

Preparation Example of Aqueous Polyepoxy Resin (II-E)

In a reaction vessel with a stirrer, equipped with a reflux condenser, a nitrogen (containing 7 to 10% oxygen) introducing tube and a thermometer, 112.5 parts of epoxy acrylate "UE-8400-M80" (manufactured by DAINIPPON INK AND CHEMICALS, Inc., MEK content of 20%), 0.1 parts of methoquinone and 15.8 parts of tetrabase anhydride "EPICLON B-4400" (manufactured by DAINIPPON INK AND CHEMICALS, Inc.) were charged and heated to 80° C. The reaction was conducted at 80° C. for five hours, and then 22.8 parts of ethyl acetate was added and dissolved. After cooling to 50° C., the reaction solution was neutralized by adding 12.1 parts of triethylamine. Solvent change was conducted by adding 370 parts of deionized water. The solution was distilled under reduced pressure at 40 to 50° C. to obtain an aqueous polyepoxy resin (II-E) having an ethylenic unsaturated double bond. It had a Gardner viscosity V, a nonvolatile content of 30.1%, an ethylenic unsaturated double bond concentration of 1.8 eq./kg and an acid value of 63.6 KOH mg/g.

(Aqueous Polyurethane)

As an aqueous polyurethane which does not have a radiation curable unsaturated group and a group of a salt in a molecule and also has a good processability, an aqueous urethane resin “SPENSOL: L-512” manufactured by DAINIPPON INK AND CHEMICALS, Inc. (nonvolatile content of 30%) was used as a “Comparative Example” as it is. It is called an “aqueous polyurethane” in Table 1.

<Preparation of Radiation Curable Aqueous Coating Composition>

In accordance with Table 1, a radiation curable aqueous coating composition containing an aqueous resin (I), and/or a mixture of an aqueous resin (II) and a phosphate compound (III) used in (Examples A-1) to (Examples A-8) was prepared. In accordance with Table 2, a radiation curable aqueous coating composition having no phosphate group used in (Comparative Examples A-1) to (Comparative Examples A-5) was prepared.

The respective components other than the aqueous resin are as described in Table 1 and Table 2.

Kayamer PM21: phosphoric acid methacrylate manufactured by NIPPON KAYAKU CO., LTD.

Biscoat 3PA: phosphoric acid acrylate manufactured by OSAKA ORGANIC CHEMICAL IND., LTD.

Irgacure 184: photopolymerization initiator manufactured by Ciba Specialty Chemicals NUC-Silicon A-174: silane coupling agent manufactured by Nippon Unicar Co., Ltd.

FZ-3153: silicone emulsion manufactured by Nippon Unicar Co., Ltd.

<Production of Coated Metal Material>

With respect to (Examples A-1) to (Examples A-8) and (Comparative Examples A-1) to (Comparative Examples A-5) described in Table 1 to Table 4, an electrogalvanized steel sheet having a thickness of 0.8 mm was coated with a radiation curable aqueous coating composition having a nonvolatile content of 20% in a coating film thickness of 1 μm using a drawdown rod #3, and this was then dried at 80° C. for two minutes by an air dryer. Using a 120 W high-pressure mercury lamp, a coating film was cured by irradiation with ultraviolet light of a dose of 130 $mJ/cm^2$. With respect to (Examples A-8), a coating film obtained by coating and drying in the same manner as in (Examples A-1 to A-7) and (Comparative Examples A-1) to (Comparative Examples A-5) was cured by irradiation with an electron beam at a total dose of 30 kGy at an acceleration voltage of 165 kV using an electrocurtain manufactured by IWASAKI ELECTRIC CO., Ltd.

<Physical Properties Test of Coating Film of Coated Metal Material>

(Solvent Resistance Test)

Test pieces of a coated metal material in size of 5×13 cm was made and 0.8 g of an absorbent cotton was mounted to a head of a rubbing tester, Type I (manufactured by Taihei Rika Industries Co., Ltd.) while being surrounded with a gauze in a size of 4.5×3.5 cm and, after impregnating the absorbent cotton with a solvent, each test piece was rubbed a predetermined number of times (5, 10, and 20 times) under a load of 300 g. Then, it was judged whether or not the substrate was exposed in accordance with the following criteria. Ethanol as an extra pure reagent was used in the ethanol resistance test, while methyl ethyl ketone as an extra pure reagent was used in the MEK resistance test.

◎: No exposed portion is observed, and slight rubbing marks are observed

○: No exposed portion is observed, but some rubbing marks are observed.

Δ: Small traces of substrate are exposed.

X: The coating is exposed as a result of peeling off.

(Adhesion Test)

The adhesion test was conducted according to JIS 5400. After scratching a grid of 11 by 11 lines, each at a spacing of 1 mm, in the coating film of each test piece at the center portion, using a cutter knife, the coating surface on which the grid was formed was turned toward the die side and a steel ball was extruded by 5 cm using an Erichsen testing machine. Then, a cellophane adhesive tape was applied on the grid and was peeled off rapidly. The area of the coating film remaining on the grid was determined and indicated by percentage.

The results of physical properties test of the coating film of the coated metal material in [Example A] are shown in Table 3 to Table 4.

TABLE 1

| | Nonvolatile content | Example A-1 | Example A-2 | Example A-3 | Example A-4 | Example A-5 | Example A-6 | Example A-7 | Example A-8 |
|---|---|---|---|---|---|---|---|---|---|
| Aqueous resin (II-U-1) | 30% | 100 | | | | | | 100 | 100 |
| Aqueous resin (II-A) | 30% | | 100.7 | | | | | | |
| Aqueous resin (I-P) | 31% | | | 97.4 | | | | | |
| Aqueous resin (II-P) | 31% | | | | 98.0 | | | | |
| Aqueous resin (I-E) | 31% | | | | | 97.1 | | | |
| Aqueous resin (II-E) | 30% | | | | | | 99.7 | | |
| Aqueous polyurethane | 30% | | | | | | | | |
| Kayamer PM21 | 100% | 3 | 3 | | 3 | | 3 | | 3 |
| Biscoat 3PA | 100% | | | | | | | | |
| Triethylamine | 0% | 1 | 1 | 1 | 1 | 1 | 1 | 1 | 1 |
| Irgacure 184 | 100% | 0.34 | 0.34 | 0.34 | 0.34 | 0.34 | 0.34 | 0.34 | |
| Isopropanol | 0% | 4.02 | 4.02 | 4.02 | 4.02 | 4.02 | 4.02 | 4.02 | 0 |
| NUC-silicon A-174 | 100% | 0.6 | 0.6 | 0.6 | 0.6 | 0.6 | 0.6 | 0.6 | 0.6 |
| FZ-3153 | 20% | 0.9 | 0.9 | 0.9 | 0.9 | 0.9 | 0.9 | 0.9 | 0.9 |
| Pure water (nonvolatile content is controlled) | | 65 | 64 | 55 | 67 | 56 | 65 | 65 | 63 |
| Total | | 175.6 | 175.6 | 160.6 | 175.6 | 160.6 | 175.6 | 175.6 | 168.9 |

TABLE 2

| | Nonvolatile content | Comp. Example A-1 | Comp. Example A-2 | Comp. Example A-3 | Comp. Example A-4 | Comp. Example A-5 |
|---|---|---|---|---|---|---|
| Aqueous resin (II-U-1) | 30% | 100 | | | | |
| Aqueous resin (II-A) | 30% | | 100.7 | | | |
| Aqueous resin (II-P) | 31% | | | 98.0 | | |
| Aqueous resin (II-E) | 30% | | | | 99.7 | |
| Aqueous polyurethane | 30% | | | | | 100 |
| Kayamer PM21 | 100% | | | | | |
| Biscoat 3PA | 100% | | | | | |
| Triethylamine | 0% | | | | | |
| Irgacure 184 | 100% | 1.34 | 1.34 | 1.34 | 1.34 | 1.34 |
| Isopropanol | 0% | 4.02 | 4.02 | 4.02 | 4.02 | 4.02 |
| NUC-silicon A-174 | 100% | 0.6 | 0.6 | 0.6 | 0.6 | 0.6 |
| FZ-3153 | 20% | 0.9 | 0.9 | 0.9 | 0.9 | 0.9 |
| Pure water (nonvolatile content is controlled) | | 54 | 53 | 56 | 54 | 54 |
| Total | | 160.6 | 160.6 | 160.6 | 160.6 | 160.6 |

TABLE 3

| | Example A-1 | Example A-2 | Example A-3 | Example A-4 | Example A-5 | Example A-6 | Example A-7 | Example A-8 |
|---|---|---|---|---|---|---|---|---|
| MEK resistance, 5 times | ◎ | ◎ | ◎ | ◎ | ◎ | ◎ | ◎ | ◎ |
| MEK resistance, 10 times | ◎ | ○ | ○ | ○ | ○ | ○ | ○ | ◎ |
| MEK resistance, 20 times | ◎ | ○ | ○ | ○ | ○ | ○ | ○ | ◎ |
| Ethanol resistance, 5 times | ◎ | ◎ | ◎ | ◎ | ◎ | ◎ | ◎ | ◎ |
| Ethanol resistance, 10 times | ◎ | ○ | ○ | ○ | ○ | ○ | ○ | ◎ |
| Ethanol resistance, 20 times | ○ | Δ | Δ | Δ | Δ | Δ | Δ | ○ |
| Adhesion | 100 | 100 | 100 | 100 | 100 | 100 | 100 | 100 |

TABLE 4

| | Comp. Example A-1 | Comp. Example A-2 | Comp. Example A-3 | Comp. Example A-4 | Comp. Example A-5 |
|---|---|---|---|---|---|
| MEK resistance, 5 times | ○ | x | x | x | x |
| MEK resistance, 10 times | x | x | x | x | x |
| MEK resistance, 20 times | x | x | x | x | x |
| Ethanol resistance, 5 times | ○ | x | x | x | x |
| Ethanol resistance, 10 times | x | x | x | x | x |
| Ethanol resistance, 20 times | x | x | x | x | x |
| Adhesion | 100 | 64 | 90 | 78 | 100 |

Example B

In Example B, the embodiment is further described in detail by way of the Example using a phosphate compound (III) represented by the general formula (1), Example of an aqueous polyurethane resin (II-U-H) using hydrogenated MDI as a raw material, the Example wherein a silane coupling agent is added and a comparison between a chromated galvanized steel sheet and a non-treated galvanized steel sheet.

Preparation Example (2) of Aqueous Polyurethane Resin (II-U)

In a reaction vessel equipped with a reflux condenser, a nitrogen introducing tube and a thermometer, 2.4 parts of polyoxyethylene glycol (Mn=600), 19.6 parts of 2,2-bis (hydroxymethyl)propionic acid, 34.4 parts of polyester diol (neopentyl glycol adipate: Mn=500), 4.4 parts of trimethylolpropane, 9.7 parts of butylethylpropanediol, 83.8 parts of "Takenate 600" (manufactured by TAKEDA CHEMICAL INDUSTRIES, Ltd.: hydrogenated MDI), 154.3 parts of methyl ethyl ketone and 0.008 parts of dibutyltin laurate were charged and heated to 70° C. with stirring over 0.5 hours. After the reaction at 70 to 75° C. for three hours, 0.05 parts of tert-butyl-hydroquinone, 44.3 parts of "LIGHT-ESTER G-201P" (manufactured by KYOEISYA CHEMICAL CO., LTD.) and 88.5 parts of MEK (methyl ethyl ketone) were added. After replacing a nitrogen introducing tube by an air introducing tube, the reaction was conducted again for ten hours while adding 0.04 parts of tert-butyl-hydroquinone at 70 to 75° C. every four hours to obtain a solution of a polyurethane resin. To the solution, 14.7 parts of triethylamine and 516.1 parts of pure water were gradually added and, after maintaining at 30° C. for two hours, 0.5 parts of "Surfinol AK02" (manufactured by NISSHIN CHEMICAL INDUSTRY CO., LTD.) was added. Then, methyl ethyl ketone was distilled off under reduced pressure at 50° C. to obtain an aqueous polyurethane resin (II-U) having a nonvolatile content of 29.3%, an acid value of the nonvolatile content of 40.5 KOH mg/g, a Gardner viscosity U-V, and an unsaturated group concentration of 1.9 eq./kg as a transparent liquid. This is referred to as an aqueous polyurethane resin (II-U-2).

Preparation Example (3) of Aqueous Polyurethane Resin (II-U)

In a reaction vessel equipped with a reflux condenser, a nitrogen introducing tube and a thermometer, 31.9 parts of "ODX2376" (adipic acid/diethylene glycol-based polyesterdiol manufactured by DAINIPPON INK AND CHEMICALS, Inc., Mw=1,000), 16.1 parts of 2,2-bis(hydroxymethyl)butanoic acid, 17.2 parts of castor oil, 59.2 parts of hydrogenated MDI, 124.4 parts of methyl ethyl ketone and 0.012 parts of dibutylthin dilaurate were charged and heated to 70° C. with stirring over 0.5 hours. After the reaction at 70 to 75° C. for three hours, 0.15 parts of tert-butyl-hydroquinone, 29.4 parts of "LIGHT-ESTER G-201P" (manufactured by KYOEISYA CHEMICAL CO., LTD.), 13.8 parts of "Sumidule N3300" (manufactured by SUMITOMO BAYER URETHANE CO., LTD.), 86.3 parts of MEK and 0.15 parts of dibutyltin laurate were added. After replacing a nitrogen introducing tube by an air introducing tube, the reaction was conducted again for ten hours while adding 0.04 parts of tert-butyl-hydroquinone at 70 to 75° C. every four hours to obtain a solution of a polyurethane resin. After cooling to 30° C., to the solution, 11 parts of triethylamine and 582.1 parts of pure water were gradually added. After stirring at 30° C. for 0.5 hours, 9.1 parts of γ-aminopropyltriethoxysilane and 21 parts of acetonitrile were added dropwise over 0.5 hours. After heating to 45° C. and maintaining at the same temperature for two hours, 0.50 parts of "Surfinol AK02" (manufactured by NISSHIN CHEMICAL INDUSTRY CO., LTD.) was added and methyl ethyl ketone was distilled off under reduced pressure at 50° C. to obtain an aqueous polyurethane resin (II-U) having a nonvolatile content of 31.6%, an acid value of the nonvolatile content of 35.1 KOH mg/g, a Gardner viscosity O-N, and an unsaturated group concentration of 1.4 eq./kg as a transparent liquid. This is referred to as an aqueous polyurethane resin (II-U-3).

Preparation Example (4) of Aqueous Polyurethane Resin (II-U)

In a reaction vessel equipped with a reflux condenser, 2.2 parts of polyoxyethylene glycol (Mn=600), 47.6 parts of castor oil-modified diol HS2G-160R" (manufactured by HOKOKU CORPORATION, Mw=760), 19.6 parts of 2,2-bis(dihydroxymethyl)butanoic acid, 8.9 parts of butylethylpropanediol, 3.95 parts of trimethylolpropane, 76.2 parts of hydrogenated MDI ("Takenate 600"), 158.3 parts of methyl ethyl ketone and 0.01 parts of dibutyltin laurate were charged and heated to 70° C. with stirring over 0.5 hours. After the reaction at 70 to 75° C. for three hours, 0.2 parts of methoquinone, 40.3 parts of "LIGHT-ESTER G-201P" (manufactured by KYOEISYA CHEMICAL CO., LTD.) and 0.16 parts of dibutyltin laurate were added. After replacing a nitrogen introducing tube by an air introducing tube, the reaction was conducted again for 15 hours while adding 0.04 parts of tert-butyl-hydroquinone at 70 to 75° C. every four hours to obtain a solution of a polyurethane resin. After cooling to 30° C., to the solution, 13.4 parts of triethylamine and 517.6 parts of pure water were gradually added and, after maintaining at 30° C. for two hours, 0.5 parts of "Surfinol AK02" (manufactured by NISSHIN CHEMICAL INDUSTRY CO., LTD.) was added and methyl ethyl ketone was distilled off under reduced pressure at 50° C. to obtain an aqueous polyurethane resin (II-U). having a nonvolatile content of 29.0%, an acid value of the nonvolatile content of 37.8 KOH mg/g, a Gardner viscosity U, and an unsaturated group concentration of 1.7 eq./kg as a transparent liquid. This is referred to as an aqueous polyurethane resin (II-U-4).

Synthetic Example of Phosphate Compound (III)

In a reaction vessel with a stirrer, equipped with a reflux condenser, an dry air introducing tube and a thermometer, 187 parts of phosphoric acid methacrylate "Kayamer PM21" (manufactured by NIPPON KAYAKU CO., LTD.), 102 parts of "Cardula E-10" (manufactured by YUKA SHELL EPOXY CO., LTD.) and 0.15 parts of methoquinone were added with stirring, heated to 75° C. and then maintained at 75° C. for three hours to obtain a phosphate compound having an acid value of a nonvolatile content of 52 KOH mg/g. This is referred to as a phosphate compound (III-G).

(Aqueous Polyurethane)

As an aqueous polyurethane which does not have a radiation curable unsaturated group and a group of a salt in a molecule and also has a good processability, an aqueous urethane resin "SPENSOL: L-512" manufactured by DAINIPPON INK AND CHEMICALS Inc. (nonvolatile content of 30%) was used as the "Comparative Example" as it is. It was described as an "aqueous polyurethane" in Table 6.

[Preparation of Radiation Curable Aqueous Coating Composition>

In accordance with Table 5 and Table 6, a radiation curable aqueous coating composition containing an aqueous resin (I), and/or an aqueous resin (II) and a phosphate compound (III) used in (Examples B-1) to (Examples B-9) was prepared. In accordance with Table 6, a radiation curable aqueous coating composition having no phosphate group used in (Comparative Examples B-1) to (Comparative Examples B-3) was prepared.

"Aquacer 537" described in Table 5 and Table 6 indicates a water-soluble olefin wax manufactured by Bic Chemie, Japan.

<Preparation of Coated Metal Material>

In the same manner as in Example A, except that those described in the column of "Rolled material" in Table 7 to Table 10 were used as the metal material, coated metal materials of (Example B-1) to (Example B-7), (Comparative Example B-2) and (Comparative Example B-3) were made by curing due to irradiation with ultraviolet light, while coated metal materials of (Example B-8) and (Comparative Example B-1) were made by curing due to irradiation with electron beam.

The metal materials described in the column of "Rolled material" in Table 7 to Table 10 are as follows.

"Aluminum sheet": non-treated aluminum plate having a thickness of 0.5 mm

"Chromated electrogalvanized steel sheet": chromated electrogalvanized steel sheet having a thickness of 0.8 mm "Non-treated electrogalvanized steel sheet": electrogalvanized steel sheet having a thickness of 0.8 mm which is not subjected to a chromate treatment "Non-treated hot-dip-galvanized steel sheet": hot-dip-galvanized steel sheet having a thickness of 0.8 mm which is not subjected to a chromate treatment "TFS": chromated steel sheet having a thickness of 0.26 mm "Tin sheet": tin sheet having a thickness of 0.26 mm obtained by tinning #50.

<Physical Properties Test of Coating Film of Coated Metal Material>

(Solvent Resistance Test)

In the same manner as in Example A, except that the predetermined number of rubbing was changed to 10, 20, and 50 times, the solvent resistance test was conducted.

(Adhesion Test)

In the same manner as in Example A, the adhesion test was conducted.

(Workability Test 1)

With respect to a test piece of a coated metal material dipped previously in boiling water, the workability test 1 was conducted in the same manner as in case of the adhesion test of Example A. Incidentally, the Erichsen extrusion distance was 3.5 mm in the case in which "Rolled material" is "TFS" and "aluminum sheet", while the extrusion distance was 5 mm in the case of various "steel sheets".

(Workability Test 2)

A test piece of a coated metal material of a size of 5×15 cm was prepared and was bent by 180° while facing the coated surface outward. A T setting sheet having the same thickness of the test piece was prepared and was bent while gripping with a vice. For the cases where the number of sheets to be inserted is 0, 1, 2, or 3, the symbol "0T", "1T", "2T" or "3T" is described in the table, respectively. The bent portion was subjected to the cellophane adhesive tape peeling test and the maximum number of T setting sheets where no peeling occurs was taken as an index of the workability.

The results of the physical properties test of coating film of the coated metal material in [Example B] are shown in Table 7 to Table 10.

As is apparent from the results of the solvent test, the adhesion test and workability test of the coated metal materials described in Table 3, Table 4 and Table 7 to Table 10, Examples are superior in all test items in spite of a small thickness of coating film, such as 3 μm or less.

TABLE 5

| | Solid content % | Example B-1 | Example B-2 | Example B-3 | Example B-4 | Example B-5 | Example B-6 |
|---|---|---|---|---|---|---|---|
| Polyurethane resin (II-U-1) | 30.0% | | | | | | |
| Polyurethane resin (II-U-2) | 29.3% | 102.4 | 81.9 | | | | |
| Polyurethane resin (II-U-3) | 31.6% | | 19.0 | | | | |
| Polyurethane resin (II-U-4) | 29.1% | | | 103.1 | 103.1 | 103.1 | 103.1 |
| Kayamer PM21 | 100% | 3 | 3 | 3 | | | |
| Phosphate (III-G) | 100% | | | | | | 3 |
| LIGHT-ESTER PM | 100% | | | | 3 | | |
| Biscoat 3PA | 100% | | | | | 3 | |
| Triethylamine | | 1 | 1 | 1 | 1 | 1 | 1 |
| Irgacure 184 | | 1.2 | 1.2 | 1.2 | 1.2 | 1.2 | |
| Darocure 1173 | | | | | | | 1.2 |
| Isopropanol | | 3.6 | 3.6 | 3.6 | 3.6 | 3.6 | 0 |
| NUC-silicon A-174 | 100% | 0.6 | 0.6 | 0.6 | 0.6 | 0.6 | 0.6 |
| Aquacer 537 | 30% | 2 | 2 | 2 | 2 | 2 | 2 |
| FZ-3153 | 20% | 3 | 3 | 3 | 3 | 3 | 3 |
| Pure water | | 57.2 | 58.7 | 56.5 | 56.5 | 56.5 | 60.1 |
| Total | | 174.0 | 174.0 | 174.0 | 174.0 | 174.0 | 174 |

TABLE 6

| | Solid content % | Example B-7 | Example B-8 | Example B-9 | Comp. Example B-1 | Comp. Example B-2 | Comp. Example B-3 |
|---|---|---|---|---|---|---|---|
| Polyurethane resin (II-U-1) | 30.0% | 100.0 | 100.0 | 100.0 | | | |
| Polyurethane resin (II-U-2) | 29.3% | | | | | 102.4 | |
| Polyurethane resin (II-U-3) | 31.6% | | | | | | |
| Polyurethane resin (II-U-4) | 29.1% | | | | | | 103.1 |
| Aqueous polyurethane | 30.0% | | | | 100.0 | | |
| Kayamer PM21 | 100% | 3 | 3 | 3 | | | 3 |
| LIGHT-ESTER PM | 100% | | | | | | |
| Biscoat 3PA | 100% | | | | | | |
| Triethylamine | 0 | 1 | 1 | 1 | | | |
| Irgacure 184 | 100 | 1.2 | 0 | 1.2 | 0 | 1.2 | 1.2 |
| Darocure 1173 | 100 | | | | | | |
| Isopropanol | 0 | 3.6 | 0 | 3.6 | 0 | 3.6 | 3.6 |
| NUC-silicon A-174 | 100% | 0.6 | 0.6 | | 0.6 | 0.6 | 0.6 |
| Aquacer 537 | 30% | 2 | 2 | 2 | 2 | 2 | 2 |
| FZ-3153 | 20% | 3 | 3 | 3 | 3 | 3 | 3 |
| Pure water | | 65.6 | 64.4 | 63.2 | 53.4 | 52.2 | 51.5 |
| Total | | 180.0 | 174.0 | 177.0 | 159 | 165.0 | 165.0 |

TABLE 7

| | Rolled material | Example B-1 | Example B-2 | Example B-3 | Example B-4 | Example B-5 | Example B-6 |
|---|---|---|---|---|---|---|---|
| Ethanol resistance, 10 times | 0.5 mm thick aluminum sheet | ○ | ○ | ○ | ○ | ○ | ○ |
| Ethanol resistance, 20 times | 0.5 mm thick aluminum sheet | Δ | ○ | Δ | Δ | Δ | Δ |
| Ethanol resistance, 50 times | 0.5 mm thick aluminum sheet | x | x | x | x | x | x |
| Ethanol resistance, 10 times | Chromated electrogalvanized steel sheet | ○ | ○ | ○ | ○ | ○ | ○ |
| Ethanol resistance, 20 times | Chromated electrogalvanized steel sheet | ○ | ○ | ○ | Δ | Δ | Δ |
| Ethanol resistance, 50 times | Chromated electrogalvanized steel sheet | x | x | x | x | x | x |
| MEK resistance, 10 times | Chromated electrogalvanized steel sheet | ○ | ○ | ○ | ○ | ○ | ○ |
| MEK resistance, 20 times | Chromated electrogalvanized steel sheet | ○ | ○ | ○ | ○ | ○ | ○ |
| MEK resistance, 50 times | Chromated electrogalvanized steel sheet | Δ | Δ | Δ | Δ | Δ | x |
| Adhesion | Aluminum sheet | 100 | 100 | 100 | 100 | 99 | 100 |
| Adhesion | Chromated electrogalvanized steel sheet | 100 | 100 | 100 | 100 | 97 | 88 |
| Adhesion | TFS | 100 | 100 | 100 | 100 | 94 | 93 |
| Adhesion | PET | 100 | 100 | 100 | 98 | 89 | 86 |
| Adhesion | Tin sheet | 100 | 100 | 100 | 99 | 96 | 86 |
| Workability test I | Chromated electrogalvanized steel sheet | 100 | 100 | 100 | 100 | 100 | 100 |
| Workability test I | TFS | 100 | 100 | 100 | 100 | 100 | 100 |
| Workability test II | Chromated electrogalvanized steel sheet | OT | OT | OT | OT | 1T | 1T |
| Workability test II | TFS | OT | OT | OT | 1T | 1T | 1T |

TABLE 8

| | Rolled material | Example B-7 | Example B-8 | Example B-9 | Comp. Example B-1 | Comp. Example B-2 | Comp. Example B-3 |
|---|---|---|---|---|---|---|---|
| Ethanol resistance, 10 times | 0.5 mm thick aluminum sheet | ○ | ○ | ○ | x | Δ | Δ |
| Ethanol resistance, 20 times | 0.5 mm thick aluminum sheet | ○ | ○ | ○ | x | x | x |
| Ethanol resistance, 50 times | 0.5 mm thick aluminum sheet | x | x | x | x | x | x |
| Ethanol resistance, 10 times | Chromated electrogalvanized steel sheet | ○ | ○ | ○ | x | Δ | Δ |
| Ethanol resistance, 20 times | Chromated electrogalvanized steel sheet | ○ | ○ | ○ | x | x | x |
| Ethanol resistance, 50 times | Chromated electrogalvanized steel sheet | Δ | Δ | Δ | x | x | x |
| MEK resistance, 10 times | Chromated electrogalvanized steel sheet | ○ | ○ | ○ | x | ○ | Δ |
| MEK resistance, 20 times | Chromated electrogalvanized steel sheet | ○ | ○ | ○ | x | Δ | x |
| MEK resistance, 50 times | Chromated electrogalvanized steel sheet | Δ | Δ | Δ | x | x | x |
| Adhesion | Aluminum sheet | 100 | 100 | 100 | 100 | 85 | 90 |
| Adhesion | Chromated electrogalvanized steel sheet | 100 | 100 | 100 | 100 | 78 | 73 |
| Adhesion | TFS | 100 | 100 | 100 | 92 | 81 | 88 |
| Adhesion | PET | 100 | 100 | 100 | 100 | 90 | 85 |
| Adhesion | Tin sheet | 100 | 100 | 100 | 93 | 68 | 66 |
| Workability test I | Chromated electrogalvanized steel sheet | 100 | 100 | 80 | 22 | 71 | 70 |
| Workability test I | TFS | 100 | 100 | 73 | 36 | 66 | 67 |
| Workability test II | Chromated electrogalvanized steel sheet | OT | OT | OT | OT | 1T | 1T |
| Workability test II | TFS | OT | OT | OT | OT | 2T | 2T |

TABLE 9

| | Rolled Material | Example B-1 | Example B-2 | Example B-3 | Example B-4 | Example B-5 | Example B-6 |
|---|---|---|---|---|---|---|---|
| Ethanol resistance, 10 times | Non-chromated galvanized steel sheet | ◎ | ◎ | ◎ | ◎ | ◎ | ○ |
| Ethanol resistance, 20 times | Non-chromated galvanized steel sheet | ○ | ○ | ○ | ○ | ○ | ○ |
| Ethanol resistance, 50 times | Non-chromated galvanized steel sheet | Δ | Δ | Δ | Δ | Δ | Δ-x |
| MEK resistance, 10 times | Non-chromated electrogalvanized steel sheet | ◎ | ◎ | ◎ | ◎ | ◎ | ○ |
| MEK resistance, 20 times | Non-chromated electrogalvanized steel sheet | ○ | ○ | ○ | ○ | ○ | ○ |
| MEK resistance, 50 times | Non-chromated electrogalvanized steel sheet | ○ | ○ | ○ | ○ | ○ | Δ |
| Adhesion | Non-chromated galvanized steel sheet | 100 | 100 | 100 | 100 | 100 | 100 |
| Adhesion | Non-chromated electrogalvanized steel sheet | 100 | 100 | 100 | 100 | 100 | 100 |
| Workability test I | Non-chromated galvanized steel sheet | 100 | 100 | 100 | 100 | 100 | 100 |
| Workability test I | Non-chromated electrogalvanized steel sheet | 100 | 100 | 100 | 100 | 100 | 100 |
| Workability test II | Non-chromated galvanized steel sheet | OT | OT | OT | OT | OT | 1T |
| Workability test II | Non-chromated electrogalvanized steel sheet | OT | OT | OT | OT | OT | OT |

TABLE 10

| | Rolled material | Example B-7 | Example B-8 | Example B-9 | Comp. Example B-1 | Comp. Example B-2 | Comp. Example B-3 |
|---|---|---|---|---|---|---|---|
| Ethanol resistance, 10 times | Non-chromated galvanized steel sheet | ◎ | ◎ | ◎ | x | Δ | Δ |

TABLE 10-continued

| | Rolled material | Example B-7 | Example B-8 | Example B-9 | Comp. Example B-1 | Comp. Example B-2 | Comp. Example B-3 |
|---|---|---|---|---|---|---|---|
| Ethanol resistance, 20 times | Non-chromated galvanized steel sheet | ○ | ○ | ○ | x | x | x |
| Ethanol resistance, 50 times | Non-chromated galvanized steel sheet | ○ | ○ | ○ | x | x | x |
| MEK resistance, 10 times | Non-chromated electrogalvanized steel sheet | ◎ | ◎ | ◎ | x | Δ | Δ |
| MEK resistance, 20 times | Non-chromated electrogalvanized steel sheet | ◎ | ◎ | ◎ | x | x | x |
| MEK resistance, 50 times | Non-chromated electrogalvanized steel sheet | ○ | ○ | ○ | x | x | x |
| Adhesion | Non-chromated galvanized steel sheet | 100 | 100 | 100 | 100 | 20 | 18 |
| Adhesion | Non-chromated electrogalvanized steel sheet | 100 | 100 | 100 | 100 | 24 | 23 |
| Workability test I | Non-chromated galvanized steel sheet | 100 | 100 | 86 | 32 | 82 | 80 |
| Workability test I | Non-chromated electrogalvanized steel sheet | 100 | 100 | 89 | 35 | 77 | 78 |
| Workability test II | Non-chromated galvanized steel sheet | OT | OT | OT | OT | 2T | 2T |
| Workability test II | Non-chromated electrogalvanized steel sheet | OT | OT | OT | OT | 2T | 2T |

INDUSTRIAL APPLICABILITY

The present invention provides a radiation curable aqueous coating composition, which is an aqueous coating composition having high safety and which is capable of improving working environment, and which has high solvent resistance that has never been attained by a conventional coating composition and has excellent adhesion to various articles to be coated, and which is also suited for use in coating compositions, coating agents, inks, primer coatings, and anchoring agents. The present invention also provides a coated metal material which has high solvent resistance, excellent adhesion to the surface of the metal material and excellent workability in spite of a small thickness of 3 μm or less of a coating film obtained by coating the surface of the metal material with an aqueous coating and curing the coating film due to irradiation with radiation, and a manufacturing method therefor. Furthermore, since a coating film of the coated metal material of the present invention has a thin film having a thickness of 3 μm or less, it is made possible to provide a method for joining a coated metal material, which comprises joining by welding in the state of having the coating film.

The invention claimed is:

1. A radiation curable aqueous coating composition comprising:

a phosphate compound having an ethylenic unsaturated double bond; and an aqueous resin having both an ethylenic unsaturated double bond and a group of a salts, which is different from the phosphate compound, wherein the content of phosphate groups in the radiation curable aqueous coating composition is within a range from 0.1 to 10.0% by weight in terms of phosphorus atoms based on the nonvolatile content in the aqueous coating composition.

2. The radiation curable aqueous coating composition according to claim 1, wherein the phosphate compound having an ethylenic unsaturated double bond is a phosphoric acid (meth)acrylate represented by the general formula (1) and/or a phosphoric acid polyether (meth)acrylate represented by the general formula (2)

General formula (1)

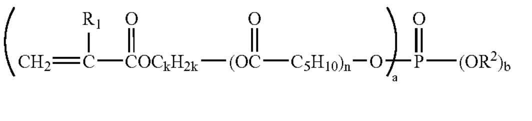

-continued $R^1$ = —H, —$CH_3$   $R^2 = C_mH_{2m+1}$ k = 2~12,  m = 0~8,  n = 0~2,  a = 1~3,  b = 0~2

General formula (2):

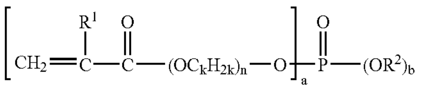

$R^1$ = —H, —$CH_3$   $R^2 = C_mH_{2m+1}$ k = 2~4,  m = 0~8,  n = 1~10,  a = 1~3,  b = 0~2.

3. The radiation curable aqueous coating composition according to claim 1, further comprising a silane coupling agent.

4. The radiation curable aqueous coating composition according to claim 1, wherein the phosphate compound having an ethylenic unsaturated double bond is neutralized with a basic compound.

5. The radiation curable aqueous coating composition according to claim 1, wherein the aqueous resin having both an ethylenic unsaturated double bond and a group of a salt is at least one aqueous resin selected from aqueous polyurethane resin, aqueous acrylic resin, aqueous polyester resin, and aqueous epoxy resin.

6. The radiation curable aqueous coating composition according to claim 5, wherein the aqueous resin having both an ethylenic unsaturated double bond and a group of a salt is an aqueous polyurethane resin having both an ethylenic unsaturated double bond and a group of a salt, and a portion or all of a polyisocyanate moiety is dicyclohexylmethane-4,4'-diisocyanate.

7. The radiation curable aqueous coating composition according to claim 1, wherein the group of a salt is at least one group selected from sulfonic acid group, N,N-di-substituted amino group, carboxyl group, neutralized sulfonic acid group, neutralized N,N-disubstituted amino group, and neutralized carboxyl group.

* * * * *